(12) United States Patent
Tomoda et al.

(10) Patent No.: US 8,686,447 B2
(45) Date of Patent: Apr. 1, 2014

(54) LIGHT EMITTING UNIT AND DISPLAY DEVICE

(75) Inventors: Katsuhiro Tomoda, Kanagawa (JP); Naoki Hirao, Kanagawa (JP); Goshi Biwa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/402,137

(22) Filed: Feb. 22, 2012

(65) Prior Publication Data

US 2012/0223345 A1 Sep. 6, 2012

(30) Foreign Application Priority Data

Mar. 1, 2011 (JP) ................................. 2011-043710

(51) Int. Cl.
*H01L 33/00* (2010.01)
(52) U.S. Cl.
USPC .................... 257/89; 257/98; 257/93; 257/88; 257/95; 257/97; 257/99; 257/100
(58) Field of Classification Search
USPC ............... 257/88, 89, 93, 98, 95, 97, 99, 100; 345/690
See application file for complete search history.

(56) References Cited

U.S. PATENT DOCUMENTS

| | | | |
|---|---|---|---|
| 6,570,190 B2 * | 5/2003 | Krames et al. | 257/94 |
| 6,590,283 B1 * | 7/2003 | Zolnowski | 257/698 |
| 6,630,689 B2 * | 10/2003 | Bhat et al. | 257/79 |
| 7,566,910 B2 * | 7/2009 | Kim et al. | 257/98 |
| 2005/0078081 A1 * | 4/2005 | Oda et al. | 345/102 |
| 2005/0233504 A1 * | 10/2005 | Doi et al. | 438/127 |
| 2006/0278886 A1 * | 12/2006 | Tomoda et al. | 257/99 |
| 2010/0109026 A1 * | 5/2010 | Onushkin et al. | 257/88 |
| 2010/0258822 A1 * | 10/2010 | Kobayashi | 257/88 |
| 2011/0157884 A1 * | 6/2011 | Chen et al. | 362/231 |

FOREIGN PATENT DOCUMENTS

JP 2007-019467 A 1/2007

* cited by examiner

*Primary Examiner* — Zandra Smith
*Assistant Examiner* — Sophia Nguyen
(74) *Attorney, Agent, or Firm* — Wolf, Greenfield & Sacks, P.C.

(57) ABSTRACT

A light emitting unit including plural kinds of light emitting elements with different light emitting wavelengths, wherein, among the light emitting elements, at least one kind of light emitting element includes a semiconductor layer configured by laminating a first conductive layer, an active layer and a second conductive layer and having a side surface exposed by the first conductive layer, the active layer and the second conductive layer; a first electrode electrically connected to the first conductive layer; a second electrode electrically connected to the second conductive layer; a first insulation layer contacting at least an exposed surface of the active layer in the surface of the semiconductor layer; and a metal layer contacting at least a surface, which is opposite to the exposed surface of the active layer, in the surface of the first insulation layer, and electrically separated from the first electrode and the second electrode.

18 Claims, 8 Drawing Sheets

LIGHT EMITTING UNIT AND DISPLAY DEVICE

BACKGROUND

The present disclosure relates to a light emitting unit having plural kinds of light emitting elements having different light emitting wavelengths, and a display device having the light emitting unit.

Recently, an LED display using LEDs (Light Emitting Diodes) as display pixels is spotlighted as a light and thin display. The LED display has no viewing angle dependence where contrast or color tone changes according to a viewing angle, and has a fast response speed when color changes. However, it is necessary to mount several million LED chips on a wiring substrate with a good production rate and connect their wires. For this reason, there is demanded a method capable of realizing a simple and easy process with a high production rate.

For example, in a method disclosed in Japanese Unexamined Patent Application Publication No. 2007-19467, first, color LEDs are transcribed on a transcribing substrate with the same pitch, and each of the plurality of colors of LEDs is covered by a resin to form a light emitting unit. After that, each light emitting unit is transcribed on a display panel substrate in a matrix form. By doing so, a display panel is manufactured in a convenient and easy way.

SUMMARY

However, in the light emitting unit disclosed in Japanese Unexamined Patent Application Publication No. 2007-19467, the light generated from each LED is output from the surface of the light emitting unit to the outside and propagates in the resin of the light emitting unit. At this time, in a case where the light propagating in the resin is a blue light with a short wavelength, if the blue light is incident to a red LED, the material included in the red LED (for example, polyimide) is degraded, so that there is a problem in that the optical output of the red LED changes. In addition, in a case where the light propagating in the resin is a green light, if the green light is incident to a red LED, the red LED may be excited and emitted by the green light. As a result, there are problems such as the creation of a crosstalk on a displayed image, the change of color temperature, and the decrease of a color reproduction range.

There is a demand for providing a light emitting unit capable of decreasing a bad influence caused by the light propagating in a resin of the light emitting unit, and a display device having the same.

According to an embodiment of the present disclosure, there is provided a light emitting unit includes plural kinds of light emitting elements with different light emitting wavelengths. Among the plural kinds of light emitting elements, at least one kind of light emitting element includes a semiconductor layer configured by laminating a first conductive layer, an active layer and a second conductive layer. The light emitting element includes a first electrode electrically connected to the first conductive layer, and a second electrode electrically connected to the second conductive layer. Further, as the semiconductor layer has the side surface exposed by the first conductive layer, the active layer and the second conductive layer, the light emitting element includes a first insulation layer contacting at least an exposed surface of the active layer in the surface of the semiconductor layer, and a metal layer contacting at least a surface, which is opposite to the exposed surface of the active layer, in the surface of the first insulation layer. The metal layer is electrically separated from the first electrode and the second electrode.

The display device according to the present disclosure includes a display panel having a plurality of light emitting units, and a driving circuit for driving each light emitting unit based on an image signal. In the display device of the present disclosure, each light emitting unit has the same components as the above light emitting unit.

In the light emitting unit and the display device according to the present disclosure, at the side surface of at least one kind of light emitting element among the plural kinds of light emitting elements, the first insulation layer contacting at least the exposed surface of the active layer and the metal layer contacting at least a surface opposite to the exposed surface of the active layer in the surface of the first insulation layer are installed. By doing so, among the light generated from the active layer, the light propagating toward the inside of the lamination surface may be reflected by the metal layer installed at the side surface of the light emitting element to disturb light incidence to an adjacent light emitting element. Here, since the metal layer is electrically separated from the first electrode and the second electrode, there is very little chance that the first electrode and the second electrode are shorted through the metal layer. For this reason, there is also very little change that the metal layer provided at the side surface gives a bad influence on the pressure resistance of the light emitting element.

However, in the present disclosure, the first insulation layer and the metal layer preferably covers at least the entire side surface of the light emitting element. In this case, among the light generated from the active layer, not only the light propagating toward the inside of the lamination surface but also the light propagating in an inclined direction are reflected by the metal layer installed at the side surface of the light emitting element so that the light incidence to an adjacent light emitting element may be further disturbed.

In addition, in the present disclosure, the first electrode is a metal electrode present at the surface of the first conductive layer and formed to contact the surface at an opposite side to the active layer, and the first insulation layer and the metal layer may be formed from a region opposite to the side surface over a region opposite to the first electrode. In this case, since a part of the first electrode and a part of the metal layer overlap each other with the first insulation layer being interposed therebetween, the light from the active layer may not easily leak out directly through the gap (interval) between the first electrode and the metal layer.

In addition, in the present disclosure, a part of the surface of a portion of the first insulation layer, which is formed in a region opposite to the first electrode, preferably becomes an exposed surface not covered by the metal layer so that a second insulation layer is formed from the exposed surface over the surface of the metal layer. Further, in the above case, a part of the surface of the first electrode preferably becomes an exposed surface not covered by the first insulation layer, the metal layer and the second insulation layer so that a pad electrode is formed from the exposed surface over the surface of the first insulation layer and the surface of the second insulation layer. In this case, since a part of the metal layer and a part of the pad electrode overlap each other with the second insulation layer being interposed therebetween, the light from the active layer substantially does not leak out through the gap (interval) between the first electrode and the metal layer, and the gap (interval) between the first electrode and the pad electrode.

In addition, in the present disclosure, in the case where the plural kinds of light emitting elements includes a light emitting element emitting a blue color, a light emitting element emitting a green color and a light emitting element emitting a red color, among these three kinds of light emitting elements, at least the light emitting element emitting a blue color and the light emitting element emitting a green color preferably have the metal layer.

According to the light emitting unit and the display device of an embodiment of the present disclosure, since, among the light generated from the active layer, the light propagating toward the inside of the lamination surface is reflected by the metal layer installed at the side surface of the light emitting element to disturb light incidence to an adjacent light emitting element, the bad influence caused by the light propagating in the light emitting unit may be reduced. In particular, in the case where the first insulation layer and the metal layer cover at least the entire side surface of the light emitting element, among the light generated from the active layer, not only the light propagating toward the inside of the lamination surface but also the light propagating in an inclined direction may be reflected at the metal layer, and so the bad influence caused by the light propagating in the resin of the light emitting unit may be greatly reduced.

However, in the light emitting unit and the display device of an embodiment of the present disclosure, in order to avoid that the first electrode and the metal layer are shorted, a gap (interval) is present between the metal layer and the first electrode. However, in a case where the first insulation layer and the metal layer are formed from a region of the semiconductor layer opposite to the side surface over a region opposite to the first electrode, a part of the first electrode and a part of the metal layer overlap each other with the first insulation layer being interposed therebetween. For this reason, the light from the active layer does not leak out through the gap (interval) between the first electrode and the metal layer. By doing so, a bad influence caused by the light propagating in the light emitting unit may be reduced without giving a bad influence on the pressure resistance of the light emitting element.

In addition, in the light emitting unit and the display device of an embodiment of the present disclosure, in the case where the second insulation layer is formed from the exposed surface of the first insulation layer over the surface of the metal layer, and further the pad electrode is formed from the exposed surface of the first electrode over the surface of the first insulation layer and the surface of the second insulation layer, since a part of the metal layer and a part of the pad electrode overlap each other with the second insulation layer being interposed therebetween, there is very little change that the light from the active layer leaks out through the gap (interval) between the first electrode and the metal layer, and between the gap (interval) between the metal layer and the pad electrode. By doing so, it is possible to prevent shorting between the metal layer and the first electrode (or, the pad electrode) more securely and to further reduce the bad influence caused by the light propagating in the light emitting unit.

DETAILED DESCRIPTION OF EMBODIMENTS

Hereinafter, embodiments of the present disclosure will be described in detail with reference to the drawings. In addition, the following description will be set forth in the following order:

1. First embodiment (a light emitting unit)
An example where element electrodes are installed at upper and lower surfaces.
2. Second embodiment (a light emitting unit)
An example where an element electrode is installed at only a lower surface.
3. Third embodiment (a display device)
An example where the light emitting unit of the above embodiments is installed as a pixel.

1. First Embodiment
Configuration

Figure 1A:
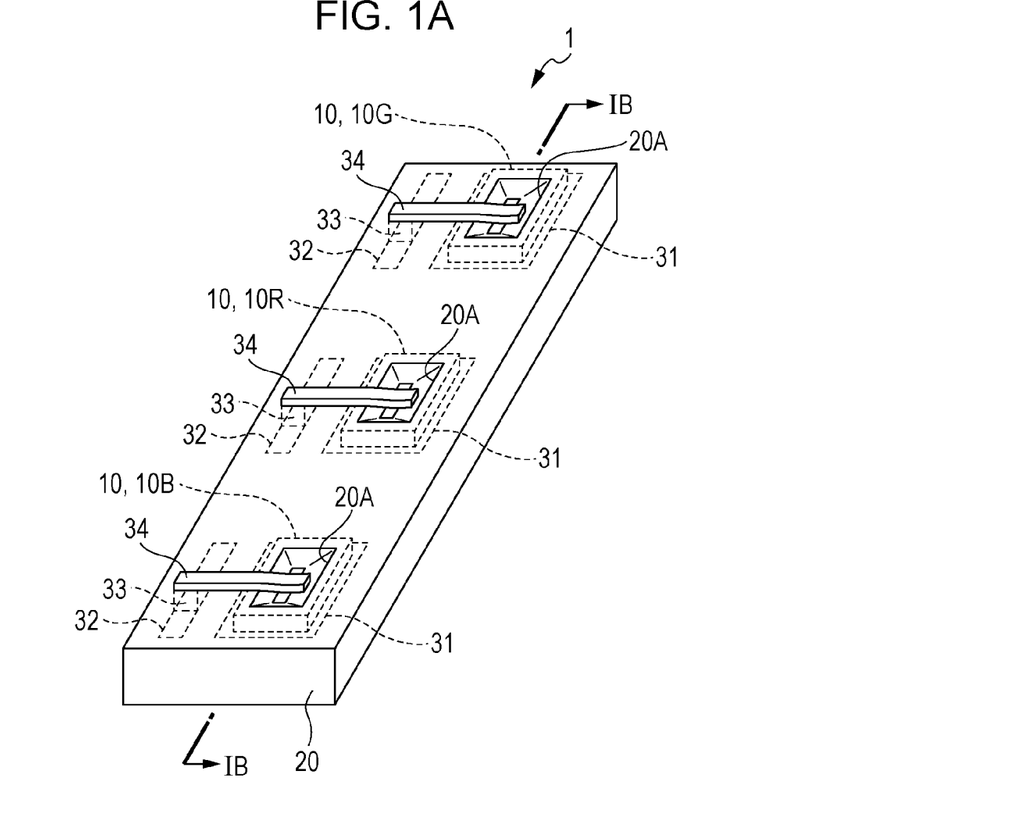
FIGS. 1A and 1B are a perspective view and a cross-sectional view showing an example of a configuration of a light emitting unit according to a first embodiment of the present disclosure.
Figure 1B:
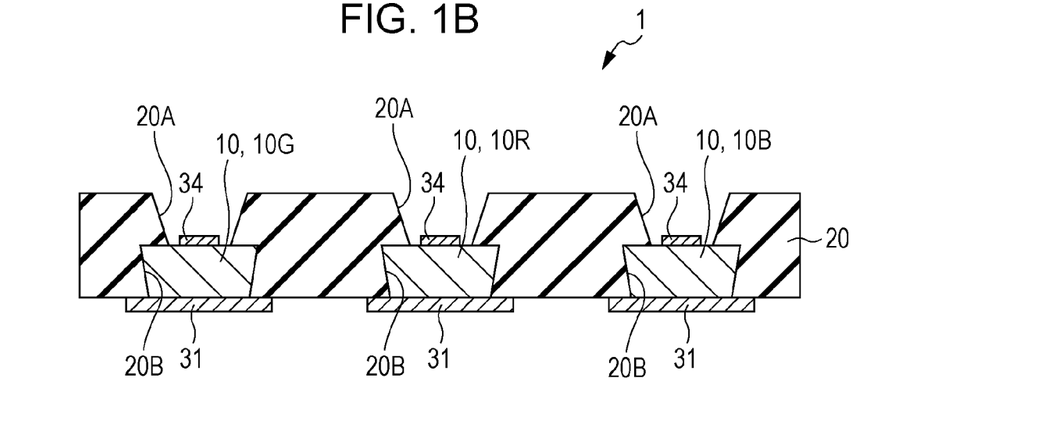

First, a light emitting unit 1 according to a first embodiment of the present disclosure will be described. FIG. 1A is a perspective view showing an example of a general configuration of the light emitting unit 1. FIG. 1B shows an example of a cross-sectional configuration of the light emitting unit 1 of FIG. 1A in an arrow direction IB-IB. The light emitting unit 1 may be very usefully applied as a display pixel of a display device which is a so-called LED display, and is a small package where a plurality of light emitting elements are surrounded by a thin resin.

Light Emitting Element 10

As shown in FIG. 1A, the light emitting unit 1 has three light emitting elements 10. Each light emitting element 10 is a solid light emitting element emitting light of a predetermined wavelength range from a surface thereof, and in detail is an LED chip. The LED chip represents a chip obtained by cutting a wafer whose crystal has grown, which is not in a package type surrounded by a molding resin or the like. The LED chip is called a micro LED since it has a size of, for example, 5 μm or above and 100 mm or less. The planar shape of the LED chip is, for example, substantially cubic. The LED chip has a thin film shape, and an aspect ratio (height/width) of the LED chip is, for example, equal to or greater than 0.1 and less than 1.

Each light emitting element 10 is disposed in the light emitting unit 1, and for example, as shown in FIG. 1A, is disposed in a row together with other light emitting elements 10 with a predetermined gap (interval) being interposed therebetween. At this time, the light emitting unit 1 has, for example, an elongated shape extending in an array direction of the light emitting element 10. A gap between two adjacent light emitting elements 10 is, for example, equal to or greater than the size of each light emitting element 10. In addition, on occasions, the gap may be smaller than the size of each light emitting element 10.

The light emitting elements 10 are respectively configured to emit lights of different wavelength ranges. For example, as shown in FIG. 1A, three light emitting elements 10 are composed of a light emitting element 10G emitting a light of a green band, a light emitting element 10R emitting a light of a red band, and a light emitting element 10B. For example, in a chase where the light emitting unit 1 has an elongated shape extending in the array direction of the light emitting element 10, the light emitting element 10G is, for example, disposed near the short side of the light emitting unit 1, and the light emitting element 10B is disposed, for example, near a short side other than the short side of the light emitting unit 1 which is near the light emitting element 10G. The light emitting element 10R is disposed, for example, between the light emitting element 10G and the light emitting element 10B. In addition, locations of the light emitting elements 10R, 10G, and 10B are respectively not limited to the above, but hereinafter, location relationship of other components may be described on the assumption that the light emitting elements 10R, 10G, and 10B are disposed at the above locations.

Figure 2A:
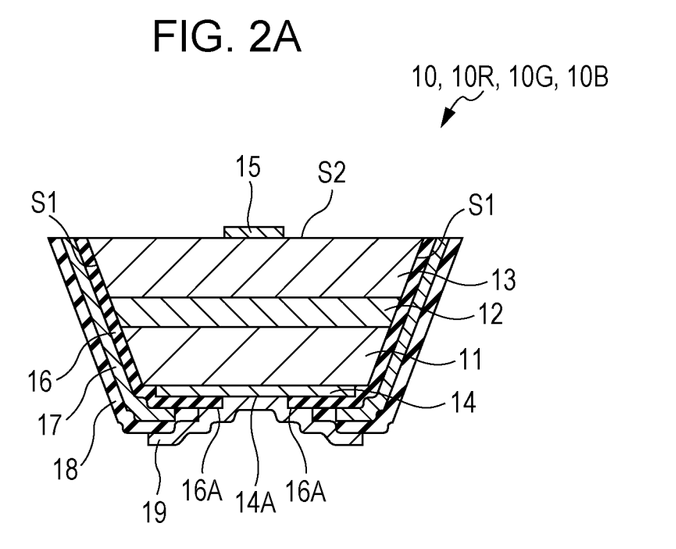
FIGS. 2A and 2B are cross-sectional views showing an example of a configuration of an optic element of FIGS. 1A and 1B.

As shown in FIG. 2A, for example, each light emitting element 10 has a semiconductor layer where a first conductive layer 11, an active layer 12 and a second conductive layer 13 are laminated in order. In the light emitting element 10G and 10B, the first conductive layer 11, the active layer 12 and the second conductive layer 13 are made of, for example, InGaN-based semiconductor material. Meanwhile, in the light emitting element 10R, the first conductive layer 11, the active layer 12 and the second conductive layer 13 are made of, for example, AlGaInP-based semiconductor material.

A second electrode 15 is installed at the surface of the second conductive layer 13 (namely, a light emitting surface S2). The second electrode 15 is made of, for example, Ti (titan)/Pt (platinum)/Au (gold), for the light emitting element 10G and 10B. The second electrode 15 is made of, for example, AuGe (an alloy of gold and germanium)/Ni (nickel)/Au, for the light emitting element 10R. The second electrode 15 contacts the second conductive layer 13 and is electrically connected to the second conductive layer 13. In other words, the second electrode 15 makes an ohmic contact with the second conductive layer 13. Meanwhile, at the lower surface of the first conductive layer 11, a first electrode 14 is installed. The first electrode 14 is a metal electrode. The first electrode 14 is made of, for example, Ti/Pt/Au for the light emitting element 10G and 10B. The first electrode 14 is made of, for example, AuGe/Ni/Au for the light emitting element 10R. The first electrode 14 contacts the first conductive layer 11 and is electrically connected to the first conductive layer 11. In other words, the first electrode 14 makes an ohmic contact with the first conductive layer 11. The first electrode 14 and the second electrode 15 may be configured as a single electrode together or may be configured as a plurality of electrodes. In addition, hereinafter, as shown in FIG. 2A, it is assumed that the first electrode 14 and the second electrode 15 are a single electrode together. The first electrode 14 and the second electrode 15 may be configured to include, for example, metal material with high reflectivity such as Ag (silver), Al (aluminum) or the like.

A side surface S1 of each light emitting element 10 (in detail, a semiconductor layer) is, for example, an inclined surface crossing a lamination direction, as shown in FIG. 2A, in detail an inclined surface where a cross section of the corresponding light emitting element 10 has an inverse trapezoidal shape. As described above, as the side surface S1 has a tapered shape, the light emitting efficiency in the front direction may be improved. In addition, the side surface S1 may be, for example, a vertical surface perpendicular to the lamination direction, as shown in FIG. 2B.

Figure 2B:
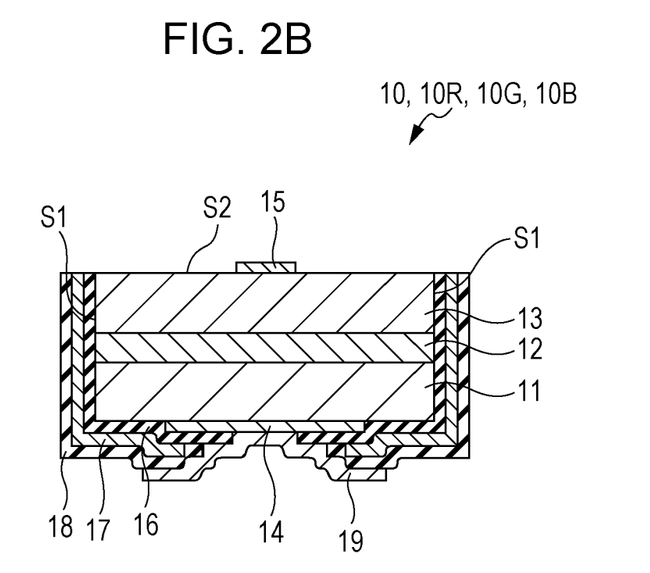

As shown in FIGS. 2A and 2B, each light emitting element 10 has, for example, a laminated body composed of a first insulation layer 16, a metal layer 17, a second insulation layer 18 and a pad electrode 19. The laminated body is a layer formed from the side surface S1 of the semiconductor layer over the lower surface. In the laminated body, at least the first insulation layer 16, the metal layer 17 and the second insulation layer 18 are respectively thin layers, for example, formed by a thin film forming process such as CVD, deposition, sputtering or the like. In other words, in the laminated body, at least the first insulation layer 16, the metal layer 17 and the second insulation layer 18 are not formed by a thick film forming process such as spin coating, resin molding, potting or the like.

The first insulation layer 16, the metal layer 17 and the second insulation layer 18 covers at least the entire side surface S1 to be formed from a region opposite to the side surface S1 over a part of a region opposite to the first electrode 14. The first insulation layer 16 is for electric insulation between the metal layer 17 and the semiconductor layer. The first insulation layer 16 is formed, among the side surface S1, from the end portion of the light emitting element 10 at the light emitting surface S2 side over the outer circumference of the surface of the first electrode 14. In other words, the first insulation layer 16 is formed to contact the entire side surface S1 of the light emitting element 10 and is further formed to contact the outer circumference of the surface of the first electrode 14. The first insulation layer 16 is made of transparent material with respect to the light generated from the active layer 12, for example, $SiO_2$, SiN, $Al_2O_3$, $TiO_2$, TiN or the like. The first insulation layer 16 has, for example, a thickness of about 0.1 μm to 1 μm, substantially regular. In addition, the first insulation layer 16 may have irregularity in thickness due to a production error.

The metal layer 17 is for covering or reflecting the light generated from the active layer 12. The metal layer 17 is formed to contact the surface of the first insulation layer 16. The metal layer 17 is formed, at the surface of the first insulation layer 16, from the end portion at the light emitting surface S2 side to a place slightly rearward from the end portion at the first electrode 14 side. In other words, the first insulation layer 16 has an exposed surface 16A not covered by the metal layer 17, at a portion opposite to the first electrode 14.

The end portion of the metal layer 17 at the light emitting surface S2 side is formed at the same surface of the end portion of the first insulation layer 16 at the light emitting surface S2 side (in other words, the same surface as the light emitting surface S2). Meanwhile, the end portion of the metal layer 17 at the first electrode 14 side is formed at a region opposite to the first electrode 14 to partially overlap the metal layer 17 with the first insulation layer 16 being interposed therebetween. In other words, the metal layer 17 is insulated (electrically separated) from the semiconductor layer, the first electrode 14 and the second electrode 15 by the first insulation layer 16.

Between the end portion of the metal layer 17 at the first electrode 14 side and the metal layer 17, a gap (interval) is present as much as the thickness of the first insulation layer 16. However, since the end portion of the metal layer 17 at the first electrode 14 side and the first electrode 14 overlap each other with the first insulation layer 16 being interposed therebetween, the gap (interval) may not be visually recognized in the lamination direction (namely, in the thickness direction). Further, the thickness of the first insulation layer 16 is just several μm at most. Therefore, the light generated from the active layer 12 is substantially not emitted to the outside directly through the gap (interval).

The metal layer 17 is made of material covering or reflecting the light generated from the active layer 12, for example, Ti, Al, Cu, Au, Ni, or their alloys. The metal layer 17 has, for example, a thickness of about 0.1 μm to 1 μm, substantially regular. In addition, the metal layer 17 may have irregularity in thickness caused by a production error.

The second insulation layer 18 is for preventing a conductive material (for example, solder, plate, sputtering metal) joining the pad electrode 19 and a mounting substrate to each other and the metal layer 17 from being shorted, when the light emitting unit 1 is mounted to the mounting substrate (not shown). The second insulation layer 18 is formed to contact the surface of the metal layer 17 and the surface of the first insulation layer 16 (the exposed surface 16A). The second insulation layer 18 is formed on the entire surface of the metal layer 17 and is formed on all or a part of the exposed surface 16A of the first insulation layer 16. In other words, the second insulation layer 18 is formed from the exposed surface 16A of the first insulation layer 16 over the surface of the metal layer 17 so that the metal layer 17 is covered by the first insulation layer 16 and the second insulation layer 18. The second insulation layer 18 is made of, for example, $SiO_2$, SiN, $Al_2O_3$, $TiO_2$, TiN or the like. In addition, the second insulation layer 18 may be made of a plurality of materials among the above materials. The second insulation layer 18 has, for example a thickness of about 0.1 μm to 1 μm, substantially regular. In addition, the second insulation layer 18 may have irregularity in thickness caused by a production error.

The pad electrode 19 is an electrode drawn from the first electrode 14 (namely, a drawn electrode). The pad electrode 19 is formed from the exposed surface 14A of the first electrode 14 over the surface of the first insulation layer 16 and the surface of the second insulation layer 18. The pad electrode 19 is electrically connected to the first electrode 14 so that a part of the pad electrode 19 overlaps a part of the metal layer 17 with the second insulation layer 18 being interposed therebetween. In other words, the pad electrode 19 is insulated (electrically separated) from the metal layer 17 by the second insulation layer 18. The pad electrode 19 is made of material reflecting the light generated from the active layer 12 with high reflectivity, for example, Ti, Al, Cu, Au, Ni, or their alloys. In addition, the pad electrode 19 may be formed a plurality of materials among the above materials.

Between the end portion of the pad electrode 19 and the metal layer 17, a gap (interval) is present as much as the thickness of the second insulation layer 18. However, since the end portion of the pad electrode 19 and the end portion of the metal layer 17 at the first electrode 14 side overlap each other, the gap (interval) may not be visually recognized in the lamination direction (namely, in the thickness direction). Further, the thickness of the second insulation layer 18 is just several μm at most. Further, since the end portion of the first electrode 14 and the metal layer 17 at the first electrode 14 side and the end portion of the pad electrode 19 overlap each other, the passage communicating with the outside from the active layer 12 through the first insulation layer 16 and the second insulation layer 18 is bent in an S shape. In other words, the passage where the light generated from the active layer 12 may pass is curved in as S shape. From the above, the first insulation layer 16 and the second insulation layer 18 used for insulating the metal layer 17 may be a passage communicating with the outside from the active layer 12, but this passage may be recognized as being configured so that the light generated from the active layer 12 may substantially not leak out since it is extremely narrow and has an S shape.

In addition, from the viewpoint that it is prevented for the light generated from the active layer 12 to be directly incident on another light emitting element 10, the metal layer 17 may not cover a portion of the active layer 12 other than the exposed surface, if it is formed on the surface of the first insulation layer 16 to contact at least a surface of the active layer 12 opposite to the exposed surface. At this time, the first insulation layer 16 may not cover the entire side surface S1, if it is formed on the surface of the semiconductor layer to cover at least the exposed surface of the active layer 12. In addition, the metal layer 17 may not cover the entire side surface S1, if it does not cover at least a surface at an adjacent light emitting element 10 side, in the side surface S1. At this time, the first insulation layer 16 may not cover the entire side surface S1 if it does not cover at least a side at an adjacent light emitting element 10 side, in the side surface S1. In addition, from the viewpoint that it is prevented for the first conductive layer 11 and the second conductive layer 13 from being shorted through the metal layer 17, in any case, it is preferable that the metal layer 17 is not drawn at the surface of the first insulation layer 16.

In addition, in the case where three light emitting elements 10 included in the light emitting unit 1 are light emitting elements 10R, 10G and 10B, it is preferred that all light emitting elements 10 have the above laminated body, but any light emitting element 10 may not have the above laminated body. For example, among three light emitting elements 10, the light emitting element 10B emitting a light of a shortest wavelength may have the above laminated body. In addition, for example, among three light emitting elements 10, the light emitting elements 10 (in detail, the light emitting elements 10G and 10B) other than the light emitting element 10R emitting a light of a longest wavelength may have the above laminated body.

Figure 3A:
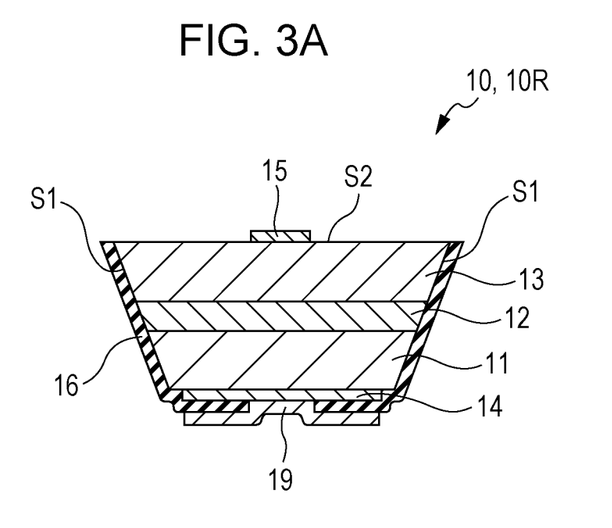
FIGS. 3A and 3B are cross-sectional views showing another example of a configuration of the optic element of FIGS. 1A and 1B.
Figure 3B:
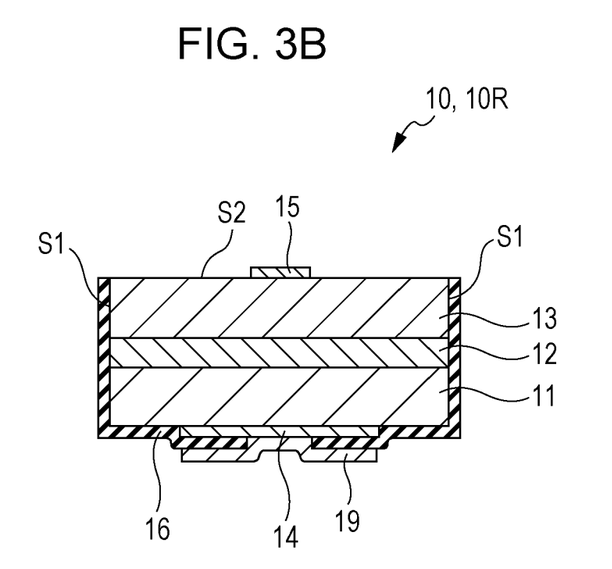

FIGS. 3A and 3B shows an example of a cross-sectional configuration of the light emitting element 10 where the above laminated body is not installed. In addition, in FIGS. 3A and 3B, the light emitting element 10R emitting a light of a longest wavelength is exemplified as the light emitting element 10 where the above laminated body is not installed. The light emitting element 10 is, for example, configured so that the metal layer 17 and the second insulation layer 18 are excluded from the above laminated body as shown in FIGS. 3A and 3B. In addition, the light emitting element 10 may be configured, on occasions, to exclude even the first insulation layer 16 and the pad electrode 19, so that the entire first electrode 14 is exposed.

Insulating body 20 and Terminal Electrodes 31 and 32

As shown in FIG. 1A, the light emitting unit 1 includes a chip-type insulating body 20 covering each light emitting element 10 and terminal electrodes 31 and 32 electrically connected to each light emitting element 10. The terminal electrodes 31 and 32 are disposed at the bottom surface side of the insulating body 20.

The insulating body 20 surrounds and retains each light emitting element 10 at least at the side surface of each light emitting element 10. The insulating body 20 is made of, for example, resin material such as silicon, acryl, epoxy or the like. The insulating body 20 may include other material such as polyimide or the like in part. The insulating body 20 is formed to contact a region where the second electrode 15 is not formed, among the side surface of each light emitting element 10 and the surface of each light emitting element 10.

The insulating body 20 has an elongated shape (for example, a rectangular parallelepiped shape) extending in the array direction of each light emitting element 10. The height of the insulating body 20 is greater than the height of each light emitting element 10, and the lateral width (the width in the short side direction) of the insulating body 20 is wider than the width of each light emitting element 10. The size of the insulating body 20 is, for example, 1 mm or less. The insulating body 20 has a thin film shape. The aspect ratio (maximum height/maximum lateral width) of the insulating body 20 is decreasing when the light emitting unit 1 is transcribed so that the light emitting unit 1 does not lie, to be, for example, ⅕ or less.

As shown in FIGS. 1A and 1B, the insulating body 20 has, for example, an opening 20A at a location corresponding to a side just above each light emitting element 10. At the bottom surface of each opening 20A, at least the second electrode 15 (not shown in FIGS. 1A and 1B) is exposed. In addition, as shown in FIGS. 1A and 1B, the insulating body 20 has, for example, an opening 20B at a location corresponding to a side just below each light emitting element 10. At the bottom surface of each opening 20B, at least the pad electrode 19 (on occasions, the first electrode 14) (not shown in FIGS. 1A and 1B) is exposed.

The pad electrode 19 (or, the first electrode 14) is connected to the terminal electrode 31 through a predetermined conductive member (for example, solder and plated metal). Meanwhile, the second electrode 15 is connected to the terminal electrode 32 through a bump 33 and a connection portion 34 shown in FIG. 1A. The bump 33 is a pillar-shaped conductive member buried in the insulating body 20, and the connection portion 34 is a band-shaped conductive member formed on the surface of the insulating body 20. In addition, the second electrode 15 may be connected to the terminal electrode 32 through a conductive member other than the bump 33 and the connection portion 34. The terminal electrodes 31 and 32 are configured to mainly include, for example, Cu (copper). A part of the surfaces of the terminal electrodes 31 and 32 may be coated with, for example, material not easily oxidized, such as Au (gold).

Effect

Next, the effects of the light emitting unit 1 of this embodiment will be described.

In this embodiment, the above laminated body is installed at the light emitting element 10B emitting a light of a shortest wavelength, among three light emitting elements 10. By doing so, among the light generated from the active layer 12 in the light emitting element 10 at which the above laminated body is installed, the light propagating toward the inside of the lamination surface may be reflected by the metal layer 17 installed at the side surface of the light emitting element 10 and disturb light incidence to an adjacent light emitting element 10. As a result, a bad influence (for example, degradation of the resin without a light resistance against a blue light) caused by the light propagating in the insulating body 20 of the light emitting unit 1 may be decreased. In addition, in a case where the above laminated body is installed to at least two light emitting elements 10B and 10G among three light emitting elements 10, the excitation of the light emitting element 10R caused by the light generated from the light emitting element 10B or the light emitting element 10G may also be disturbed. Therefore, the change of color temperature or the range of color reproduction may be reduced.

In particular, in a case where the first insulation layer 16 and the metal layer 17 cover at least the entire side surface S1 of the light emitting element 10, among the light generated from the active layer 12, not only the light propagating toward the inside of the lamination surface but also the light propagating in an inclined direction may be reflected to the metal layer 17. As a result, a bad influence caused by the light propagating in the insulating body 20 of the light emitting unit 1 may be greatly reduced.

In addition, since the metal layer 17 installed at the side surface S1 is electrically separated from the first electrode 14 and the second electrode 15, there is very little change that the first electrode 14 and the second electrode 15 are shorted through the metal layer 17. For this reason, there is also very little change that the metal layer 17 installed at the side surface S1 gives a bad influence on a pressure resistance of the light emitting element 10.

However, in this embodiment, in order to avoid that the first electrode 14 and the metal layer 17 are shorted, a gap (interval) is present between the metal layer 17 and the first electrode 14. However, since the first insulation layer 16 and the metal layer 17 are formed from a region of the semiconductor layer opposite to the side surface S1 over a region opposite to the first electrode 14, a part of the first electrode 14 and a part of the metal layer 17 overlap each other with the first insulation layer 16 being interposed therebetween. For this reason, the light from the active layer 12 does not directly leak out to the insulating body 20 through the gap (interval) between the first electrode 14 and the metal layer 17. By doing so, a bad influence caused by the light propagating in the insulating body of the light emitting unit 1 may be reduced without giving a bad influence on the pressure resistance of the light emitting element 10.

In addition, in this embodiment, the second insulation layer 18 is formed from the exposed surface 16A of the first insulation layer 16 over the surface of the metal layer 17, and further the pad electrode 19 is formed from the exposed surface 14A of the first electrode 14 over the surface of the first insulation layer 16 and the surface of the second insulation layer 18. By doing so, since a part of the metal layer 17 and a part of the pad electrode 19 overlap each other with the second insulation layer 18 being interposed therebetween, there is very little change that the light from the active layer 12 leaks out to the insulating body 20 through the gap (interval) between the first electrode 14 and the metal layer 17, and between the gap (interval) between the metal layer 17 and the pad electrode 19. As a result, it is possible to prevent shorting between the metal layer 17 and the first electrode 14 (or, the pad electrode 19) more securely and to further reduce the bad influence caused by the light propagating in the insulating body 20 of the light emitting unit 1.

2. Second Embodiment

Configuration

Figure 4A:
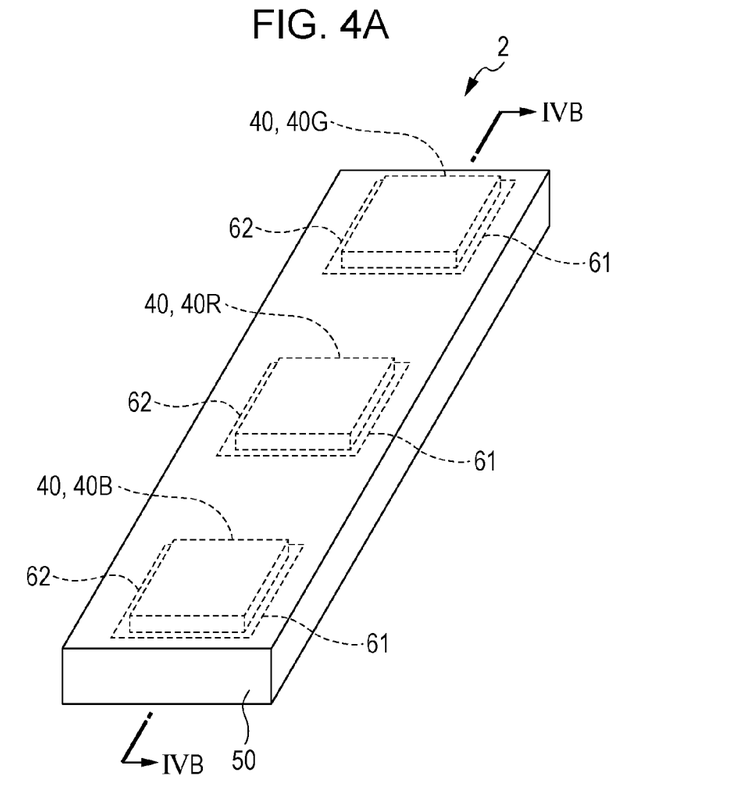
FIGS. 4A and 4B are a perspective view and a cross-sectional view showing an example of a configuration of a light emitting unit according to a second embodiment of the present disclosure.
Figure 4B:
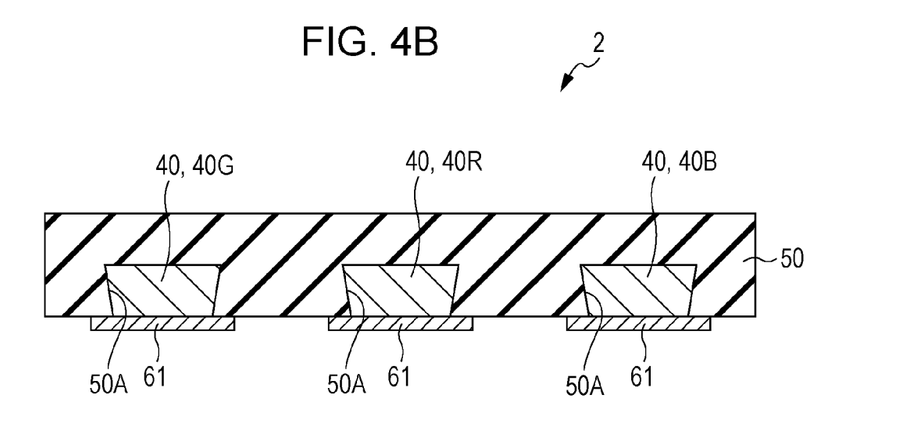

Next, a light emitting unit 2 according to a second embodiment of the present disclosure will be described. FIG. 4A is a perspective view showing an example of a general configuration of the light emitting unit 2. FIG. 4B shows an example of a cross-sectional configuration of the light emitting unit 2 of FIG. 4A in an arrow direction IVB-IVB. The light emitting unit 2 may be very suitably applied as a display pixel of a display device which is a so-called LED display, and is a small package where a plurality of light emitting elements are surrounded by a thin resin, similar to the light emitting unit 1 of the former embodiment.

Light Emitting Element 40

As shown in FIG. 4A, the light emitting unit 2 has three light emitting elements 40. Each light emitting element 40 is a solid light emitting element emitting light of a predetermined wavelength range from a surface thereof, and in detail is an LED chip. The LED chip represents a chip obtained by cutting a wafer whose crystal has grown, which is not in a package type surrounded by a molding resin or the like. The LED chip is called a micro LED since it has a size of, for example, 5 μm or above and 100 mm or less. The planar shape of the LED chip is, for example, substantially cubic. The LED chip has a thin film shape, and an aspect ratio (height/width) of the LED chip is, for example, equal to or greater than 0.1 and less than 1.

Each light emitting element 40 is disposed in the light emitting unit 2, and for example, as shown in FIG. 4A, is disposed in a row together with other light emitting elements 40 with a predetermined gap (interval) being interposed therebetween. At this time, the light emitting unit 2 has, for example, an elongated shape extending in an array direction of the light emitting element 40. A gap between two adjacent light emitting elements 40 is, for example, equal to or greater than the size of each light emitting element 40. In addition, on occasions, the gap may be smaller than the size of each light emitting element 40.

The light emitting elements 40 are respectively configured to emit lights of different wavelength ranges. For example, as shown in FIG. 4A, three light emitting elements 40 are composed of a light emitting element 40G emitting a light of a green band, a light emitting element 40R emitting a light of a red band, and a light emitting element 40B. For example, in a chase where the light emitting unit 2 has an elongated shape extending in the array direction of the light emitting element 40, the light emitting element 40G is, for example, disposed near the short side of the light emitting unit 2, and the light emitting element 40B is disposed, for example, near a short side other than the short side of the light emitting unit 2 which is near the light emitting element 40G. The light emitting element 40R is disposed, for example, between the light emitting element 40G and the light emitting element 40B. In addition, locations of the light emitting elements 40R, 40G, and 40B are respectively not limited to the above, but hereinafter, location relationship of other components may be described on the assumption that the light emitting elements 40R, 40G, and 40B are disposed at the above locations.

Figure 5A:
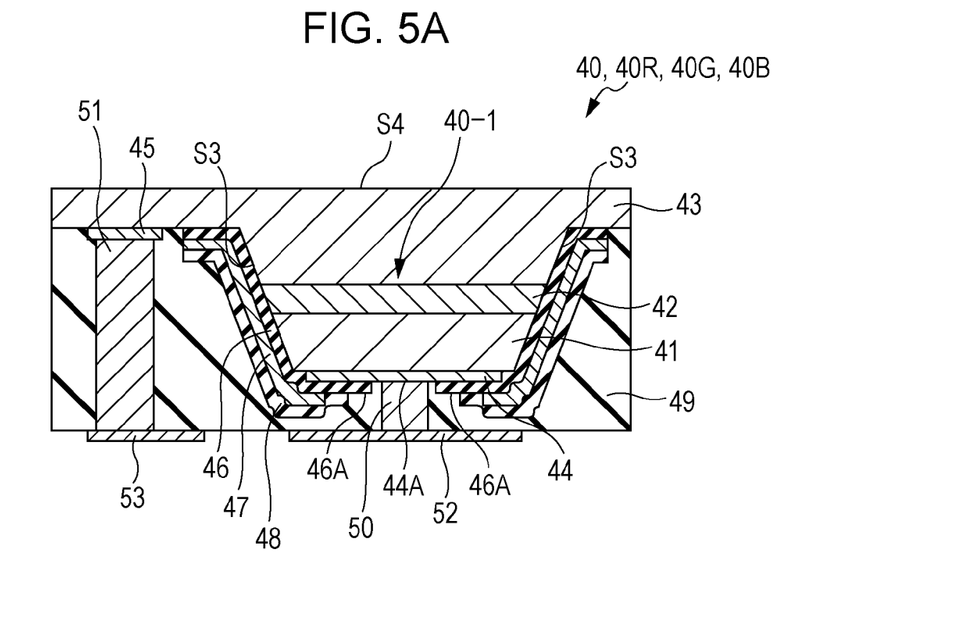
FIGS. 5A and 5B are cross-sectional views showing an example of a configuration of an optic element of FIGS. 4A and 4B.

As shown in FIG. 5A, for example, each light emitting element 40 has a semiconductor layer where a first conductive layer 41, an active layer 42 and a second conductive layer 43 are laminated in order. In addition, FIG. 5A shows an example of a cross-sectional configuration when the light emitting element 40 is cut in a direction perpendicular to the line VA-VA of FIG. 4A. In the light emitting element 40G and 40B, the first conductive layer 41, the active layer 42 and the second conductive layer 43 are made of, for example, InGaN-based semiconductor material.

Meanwhile, in the light emitting element 40R, the first conductive layer 41, the active layer 42 and the second conductive layer 43 are made of, for example, AlGaInP-based semiconductor material.

In the semiconductor layer of each light emitting element 40, a part of the second conductive layer 43 And a portion including the active layer 42 and the first conductive layer 41 become a pillar-shaped mesa portion 40-1. In the semiconductor layer, at the bottom side of the mesa portion 40-1, a flat surface where the second conductive layer 43 is exposed is spread, and a second electrode 45 is formed at a part of the flat surface. The second electrode 45 is a metal electrode. The second electrode 45 is made of, for example, Ti/Pt/Au for the light emitting elements 40G and 40B. The second electrode 45 is made of, for example, AuGe/Ni/Au for the light emitting element 40R. The second electrode 45 contacts the second conductive layer 43 and is electrically connected to the second conductive layer 43. In other words, the second electrode 45 makes an ohmic contact with the second conductive layer 43. In addition, the surface of the second conductive layer 43 (namely, the surface of the semiconductor opposite to the mesa portion 40-1) becomes a light emitting surface S4 so that a light shielding structure such as an electrode is not installed. At the surface of the mesa portion 40-1 (namely, the surface of the first conductive layer 41), a first electrode 44 is installed. The first electrode 44 is a metal electrode. The first electrode 44 is made of, for example, Ti/Pt/Au for the light emitting element 40G and 40B. The first electrode 44 is made of, for example, AuGe/Ni/Au for the light emitting element 40R. The first electrode 44 contacts the first conductive layer 41 and is electrically connected to the first conductive layer 41. In other words, the first electrode 44 makes an ohmic contact with the first conductive layer 41. The first electrode 44 and the second electrode 45 may be configured as a single electrode together or may be configured as a plurality of electrodes. In addition, hereinafter, as shown in FIG. 5A, it is assumed that the first electrode 44 and the second electrode 45 are a single electrode together. The first electrode 44 and the second electrode 45 may be configured to include, for example, metal material with high reflectivity such as Ag, Al or the like.

A side surface S3 of the mesa portion 40-1 is, for example, an inclined surface crossing a lamination direction, as shown in FIG. 5A, in detail an inclined surface where a cross section of the mesa portion 40-1 has an inverse trapezoidal shape. As described above, as the side surface S3 has a tapered shape, the light emitting efficiency in the front direction may be improved. In addition, the side surface S3 may be, for example, a vertical surface perpendicular to the lamination direction, as shown in FIG. 5B.

Figure 5B:
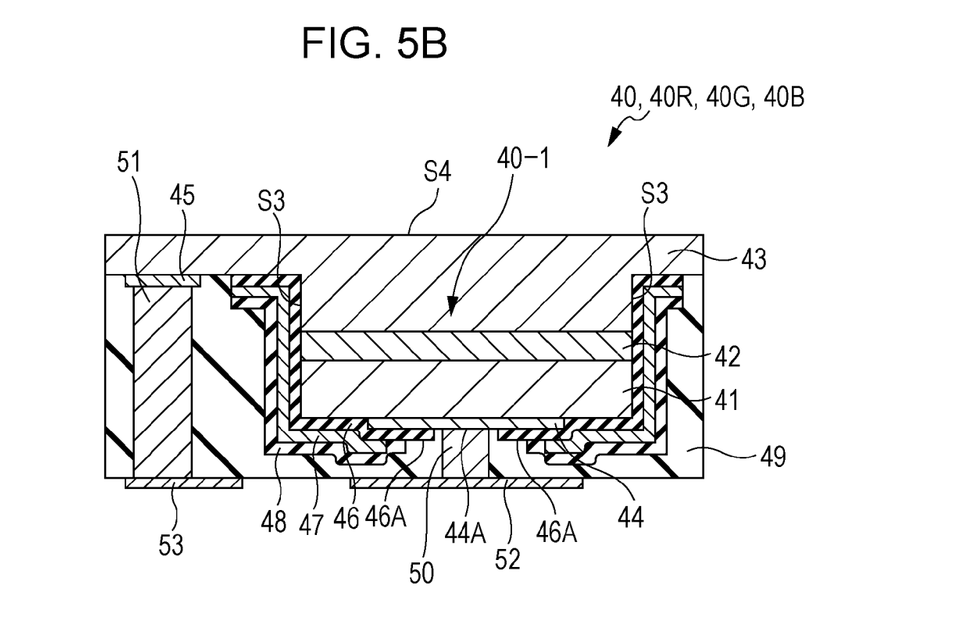

As shown in FIGS. 5A and 5B, each light emitting element 40 has, for example, a laminated body composed of a first insulation layer 46, a metal layer 47, and a second insulation layer 48. The laminated body is a layer formed from the side surface S3 of the mesa portion 40-1 over the surface. The first insulation layer 46, the metal layer 47 and the second insulation layer 48 are respectively thin layers, for example, formed by a thin film forming process such as CVD, deposition, sputtering or the like. In other words, the first insulation layer 46, the metal layer 47 and the second insulation layer 48 are not formed by a thick film forming process such as spin coating, resin molding, potting or the like.

The first insulation layer 46, the metal layer 47 and the second insulation layer 48 covers at least the entire side surface S3 to be formed from a region opposite to the side surface S3 over a part of a region opposite to the first electrode 44. The first insulation layer 46 is for electric insulation between the metal layer 47 and the semiconductor layer. The first insulation layer 46 is formed, among the side surface S3, from the end portion of the mesa portion 40-1 at the bottom side over the outer circumference of the surface of the first electrode 44. In other words, the first insulation layer 46 is formed to contact the entire side surface S3 and is further formed to contact the outer circumference of the surface of the first electrode 44. The first insulation layer 46 is made of transparent material with respect to the light generated from the active layer 42, for example, $SiO_2$, SiN, $Al_2O_3$, $TiO_2$, TiN or the like. The first insulation layer 46 has, for example, a thickness of about 0.1 μm to 1 μm, substantially regular. In addition, the first insulation layer 46 may have irregularity in thickness due to a production error.

The metal layer 47 is for covering or reflecting the light generated from the active layer 42. The metal layer 47 is formed to contact the surface of the first insulation layer 46. The metal layer 47 is formed, at the surface of the first insulation layer 46, from the end portion at the light emitting surface S4 side to a place slightly rearward from the end portion at the first electrode 44 side. In other words, the first insulation layer 46 has an exposed surface 46A not covered by the metal layer 47, at a portion opposite to the first electrode 44.

The end portion of the metal layer 47 at the light emitting surface S4 side is formed on the end portion of the first insulation layer 46 at the light emitting surface S4 side. Meanwhile, the end portion of the metal layer 47 at the first electrode 44 side is formed at a region opposite to the first electrode 44 to partially overlap the metal layer 47 with the first insulation layer 46 being interposed therebetween. In other words, the metal layer 47 is insulated (electrically separated) from the semiconductor layer, the first electrode 44 and the second electrode 45 by the first insulation layer 46.

Between the end portion of the metal layer 47 at the first electrode 44 side and the metal layer 47, a gap (interval) is present as much as the thickness of the first insulation layer 46. However, since the end portion of the metal layer 47 at the first electrode 44 side and the first electrode 44 overlap each other, the gap (interval) may not be visually recognized in the lamination direction (namely, in the thickness direction). Further, the thickness of the first insulation layer 46 is just several μm at most. Therefore, the light generated from the active layer 42 is substantially not emitted to the outside directly through the gap (interval).

The metal layer 47 is made of material covering or reflecting the light generated from the active layer 42, for example, Ti, Al, Cu, Au, Ni, or their alloys. The metal layer 47 has, for example, a thickness of about 0.1 μm to 1 μm, substantially regular. In addition, the metal layer 47 may have irregularity in thickness caused by a production error.

The second insulation layer 48 is for preventing a conductive material (for example, solder, plate, sputtering metal) joining the pad electrode 52 and a mounting substrate to each other and the metal layer 47 from being shorted, when the light emitting unit 2 is mounted to the mounting substrate (not shown). The second insulation layer 48 is formed to contact the surface of the metal layer 47 and the surface of the first insulation layer 46 (the exposed surface 46A). The second insulation layer 48 is formed on the entire surface of the metal layer 47 and is formed on all or a part of the exposed surface 46A of the first insulation layer 46. In other words, the second insulation layer 48 is formed from the exposed surface 46A of the first insulation layer 46 over the surface of the metal layer 47 so that the metal layer 47 is covered by the first insulation layer 46 and the second insulation layer 48. The second insulation layer 48 is made of, for example, $SiO_2$, SiN, $Al_2O_3$, $TiO_2$, TiN or the like. In addition, the second insulation layer 48 may be made of a plurality of materials among the above materials. The second insulation layer 48 has, for example a thickness of about 0.1 μm to 1 μm, substantially regular. In addition, the second insulation layer 48 may have irregularity in thickness caused by a production error.

Each light emitting element 40 further includes an embedding layer 49 which covers the mesa portion 40-1, bumps 50 and 51 formed in the embedding layer 49, and pad electrodes 52 and 53 formed on the embedding layer 49. The bump 50 is electrically connected to the first electrode 44 so that the surface of the bump 50 is formed, for example, on the same surface as the surface of the embedding layer 49. The bump 51 is electrically connected to the second electrode 45 so that the surface of the bump 51 is formed in the same surface as the surface of the embedding layer 49. The pad electrode 52 contacts the bump 50 to be electrically connected to the first electrode 44 through the bump 50. The pad electrode 53 contacts the bump 51 to be electrically connected to the second electrode 45 through the bump 51. The bumps 50 and 51 and the pad electrodes 52 and 53 are electrically separated from the metal layer 47 by the embedding layer 49 and the second insulation layer 48.

The embedding layer 49 is made of, for example, resin material such as silicon, acryl, epoxy or the like, or inorganic material such as $SiO_2$, SiN, $Al_2O_3$, $TiO_2$, TiN or the like. In addition, the embedding layer 49 may be excluded if necessary. The bumps 50 and 51 may be made of, for example, metal material such as Cu, solder or the like. In addition, the bumps 50 and 51 may be excluded if necessary. The pad electrodes 52 and 53 may be made of, for example, metal materials such as Ti, Al, Cu, Au, Ni, or their alloys or the like. In addition, the pad electrodes 52 and 53 may be a plurality of materials among the above materials.

The pad electrode 52 is an electrode drawn from the first electrode 44 (namely, a drawn electrode). The pad electrode 52 is formed at least at a region opposite to the first electrode 44, and in detail, is formed at a region which includes a region opposite to the first electrode 44 and a region of the metal layer 47 opposite to the end portion at the first electrode 44 side. In other words, a part of the pad electrode 52 overlaps a part of the metal layer 47 with the embedding layer 49 and the second insulation layer 48 being interposed therebetween.

Between the end portion of the pad electrode 52 and the metal layer 47, a gap (interval) is present as much as the thickness of the embedding layer 49 and the second insulation layer 48. However, since the end portion of the pad electrode 52 and the end portion of the metal layer 47 at the first electrode 44 side overlap each other, the gap (interval) may not be visually recognized in the lamination direction (namely, in the thickness direction). Further, the distance between the end portion of the pad electrode 52 and the metal layer 47 (namely, the thickness of the embedding layer 49 and the second insulation layer 48) is just several μm at most. Further, since the end portion of the first electrode 44 and the metal layer 47 at the first electrode 44 side and the end portion of the pad electrode 52 overlap each other, the passage communicating with the outside from the active layer 42 through the first insulation layer 46, the second insulation layer 48 and the embedding layer 49 is bent in an S shape. In other words, the passage where the light generated from the active layer 42 may pass is curved in as S shape. From the above, the first insulation layer 46, the second insulation layer 48 and the embedding layer 49 used for insulating the metal layer 47 may be a passage communicating with the outside from the active layer 42, but this passage may be recognized as being configured so that the light generated from the active layer 42 may substantially not leak out since it is extremely narrow and has an S shape.

In addition, from the viewpoint that it is prevented for the light generated from the active layer 42 to be directly incident on another light emitting element 40, the metal layer 47 may not cover a portion of the active layer 42 other than the exposed surface, if it is formed on the surface of the first insulation layer 46 to contact at least a surface of the active layer 42 opposite to the exposed surface. At this time, the first insulation layer 46 may not cover the entire side surface S3, if it is formed on the surface of the semiconductor layer to cover at least the exposed surface of the active layer 42. In addition, the metal layer 47 may not cover the entire side surface S3, if it does not cover at least a surface at an adjacent light emitting element 40 side, in the side surface S3. At this time, the first insulation layer 46 may not cover the entire side surface S3 if it does not cover at least a side at an adjacent light emitting element 40 side, in the side surface S3.

In addition, in the case where three light emitting elements 40 included in the light emitting unit 2 are light emitting elements 40R, 40G and 40B, it is preferred that all light emitting elements 40 have the above laminated body, but any light emitting element 40 may not have the above laminated body. For example, among three light emitting elements 40, the light emitting element 40B emitting a light of a shortest wavelength may have the above laminated body. In addition, for example, among three light emitting elements 40, the light emitting element 40R may have the above laminated body since it emits a light of a longest wavelength.

Figure 6A:
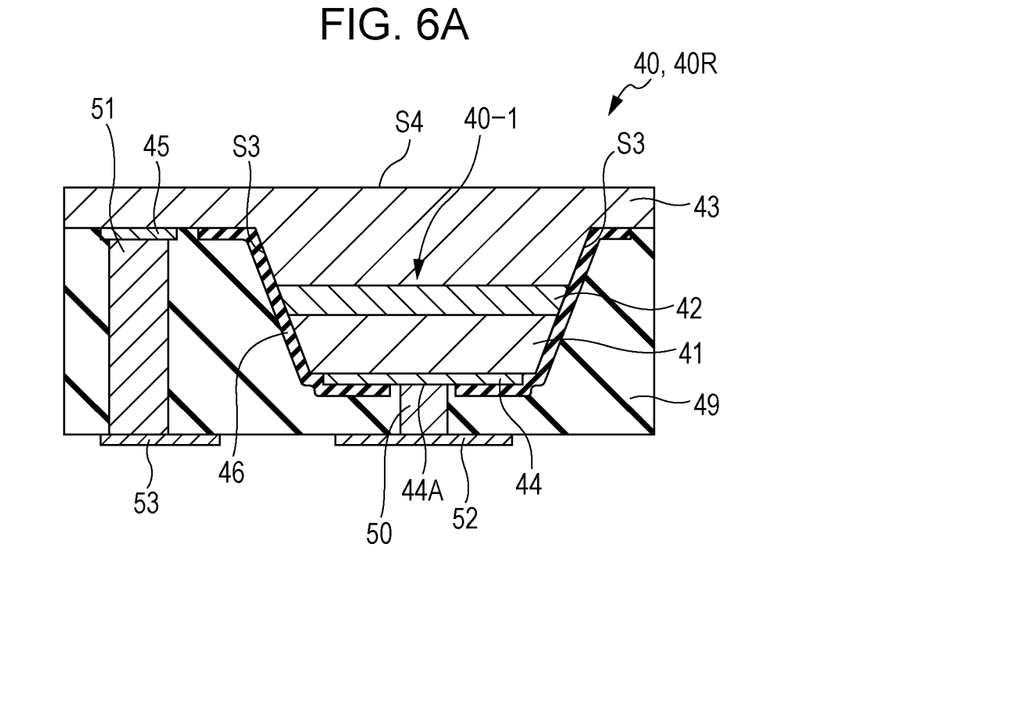
FIGS. 6A and 6B are cross-sectional views showing another example of a configuration of the optic element of FIGS. 4A and 4B.
Figure 6B:
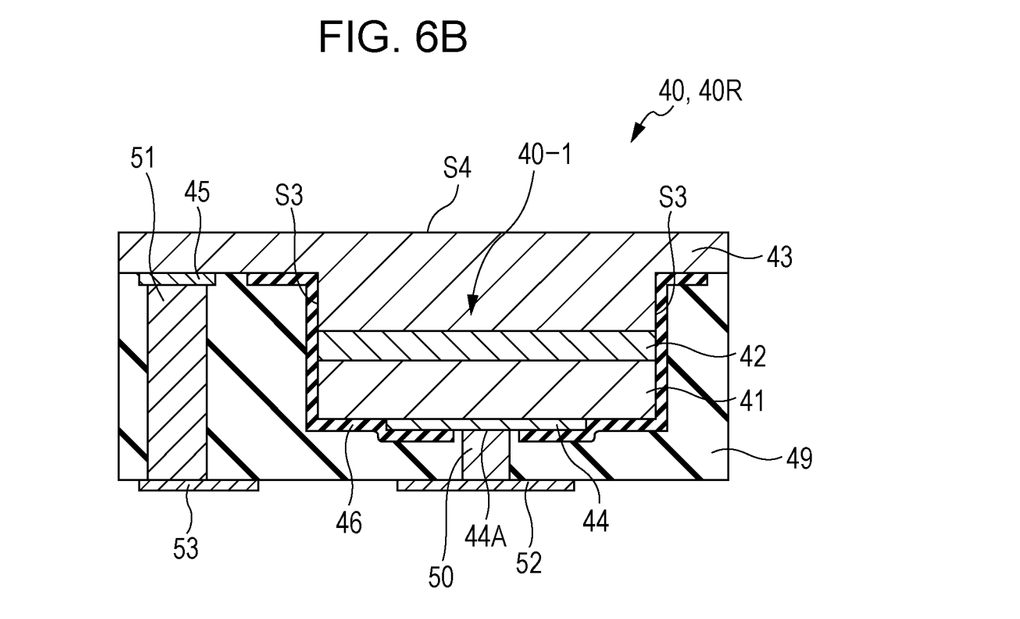

FIGS. 6A and 6B shows an example of a cross-sectional configuration of the light emitting element 40 where the above laminated body is not installed. In addition, in FIGS. 6A and 6B, the light emitting elements 40 (in detail, the light emitting element 40G and the light emitting element 40B) other than the light emitting element 40R emitting a light of a longest wavelength are exemplified as the light emitting element 40 where the above laminated body is not installed. The light emitting element 40 is, for example, configured so that the metal layer 47 and the second insulation layer 48 are excluded from the above laminated body as shown in FIGS. 6A and 6B.

Insulating Body 50 and Terminal Electrodes 61 and 62

As shown in FIG. 4A, the light emitting unit 2 includes a chip-type insulating body 50 covering each light emitting element 40 and terminal electrodes 61 and 62 electrically connected to each light emitting element 40. The terminal electrodes 61 and 62 are disposed at the bottom surface side of the insulating body 50.

The insulating body 50 surrounds and retains each light emitting element 40 at least at the side surface of each light emitting element 40. The insulating body 50 is made of, for example, resin material such as silicon, acryl, epoxy or the like. The insulating body 50 may include other material such as polyimide or the like in part. The insulating body 50 is formed to contact the side surface of each light emitting element 40 and the surface of each light emitting element 40. The insulating body 50 has an elongated shape (for example, a rectangular parallelepiped shape) extending in the array direction of each light emitting element 40. The height of the insulating body 50 is greater than the height of each light emitting element 40, and the lateral width (the width in the short side direction) of the insulating body 50 is wider than the width of each light emitting element 40. The size of the insulating body 50 is, for example, 1 mm or less. The insulating body 50 has a thin film shape. The aspect ratio (maximum height/maximum lateral width) of the insulating body 50 is decreasing when the light emitting unit 2 is transcribed so that the light emitting unit 2 does not lie, to be, for example, ⅕ or less.

As shown in FIGS. 4A and 4B, the insulating body 50 has, for example, an opening 50A at a location corresponding to a side just below each light emitting element 40. At the bottom surface of each opening 50A, at least the pad electrode 52 (not shown in FIGS. 4A and 4B) is exposed. The pad electrode 52 is connected to the terminal electrode 61 through a predetermined conductive member (for example, solder and plated metal). Meanwhile, the pad electrode 53 is connected to the terminal electrode 62 through a predetermined conductive member (for example, solder and plated metal). The terminal electrodes 61 and 62 are configured to mainly include, for example, Cu (copper). A part of the surfaces of the terminal electrodes 61 and 62 may be coated with, for example, material not easily oxidized, such as Au (gold).

Effect

Next, the effects of the light emitting unit 2 of this embodiment will be described.

In this embodiment, the above laminated body is installed at the light emitting element 40B emitting a light of a shortest wavelength, among three light emitting elements 40. By doing so, among the light generated from the active layer 42 in the light emitting element 40 at which the above laminated body is installed, the light propagating toward the inside of the lamination surface may be reflected by the metal layer 47 installed at the side surface of the light emitting element 40 and disturb light incidence to an adjacent light emitting element 40. As a result, a bad influence (for example, degradation of the resin without a light resistance against a blue light) caused by the light propagating in the insulating body 50 of the light emitting unit 2 may be decreased. In addition, in a case where the above laminated body is installed to at least two light emitting elements 40B and 40G among three light emitting elements 40, the excitation of the light emitting element 40R caused by the light generated from the light emitting element 40B or the light emitting element 40G may also be disturbed. Therefore, the change of color temperature or the range of color reproduction may be reduced.

In particular, in a case where the first insulation layer 46 and the metal layer 47 cover at least the entire side surface S3 of the mesa portion 40-1, among the light generated from the active layer 42, not only the light propagating toward the inside of the lamination surface but also the light propagating in an inclined direction may be reflected to the metal layer 47. As a result, a bad influence caused by the light propagating in the insulating body 50 of the light emitting unit 2 may be greatly reduced.

However, since the metal layer 47 installed at the side surface S3 is electrically separated from the first electrode 44 and the second electrode 45, there is very little change that the first electrode 44 and the second electrode 45 are shorted through the metal layer 47. For this reason, there is also very little change that the metal layer 47 installed at the side surface S3 gives a bad influence on a pressure resistance of the light emitting element 40.

However, in this embodiment, in order to avoid that the first electrode 44 and the metal layer 47 are shorted, a gap (interval) is present between the metal layer 47 and the first electrode 44. However, since the first insulation layer 46 and the metal layer 47 are formed from a region of the mesa portion 40-1 opposite to the side surface S3 over a region opposite to the first electrode 44, a part of the first electrode 44 and a part of the metal layer 47 overlap each other with the first insulation layer 46 being interposed therebetween. For this reason, the light from the active layer 42 does not directly leak out to the insulating body 50 through the gap (interval) between the first electrode 44 and the metal layer 47. By doing so, a bad influence caused by the light propagating in the insulating body of the light emitting unit 2 may be reduced without giving a bad influence on the pressure resistance of the light emitting element 40.

In addition, in this embodiment, the second insulation layer 48 is formed from the exposed surface 46A of the first insulation layer 46 over the surface of the metal layer 47, and further the pad electrode 52 is formed at a region including a region opposite the first electrode 44 and the end portion of the metal layer 47 at the first electrode 44 side. By doing so, since a part of the metal layer 47 and a part of the pad electrode 52 overlap each other with the second insulation layer 48 and the embedding layer 49 being interposed therebetween, there is very little change that the light from the active layer 42 leaks out to the insulating body 50 through the gap (interval) between the first electrode 44 and the metal layer 47, and between the gap (interval) between the metal layer 47 and the pad electrode 52. As a result, it is possible to prevent shorting between the metal layer 47 and the first electrode 44 (or, the pad electrode 52) more securely and to further reduce the bad influence caused by the light propagating in the insulating body 50 of the light emitting unit 2.

Modification of the Second Embodiment

Figure 7A:
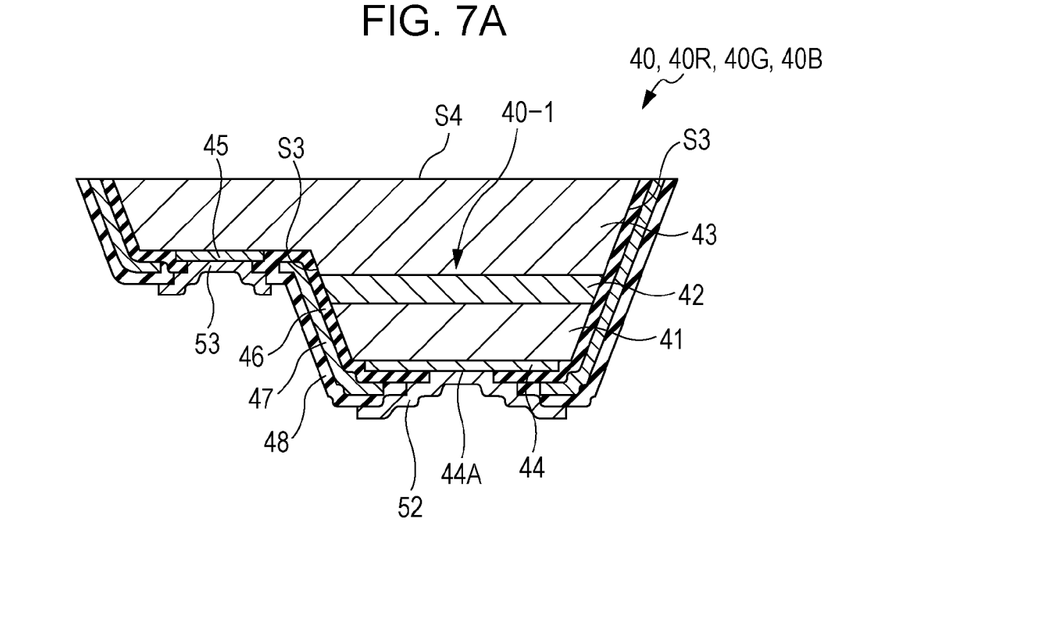
FIGS. 7A and 7B are cross-sectional views showing a modification of a configuration of the optic element of FIGS. 4A and 4B.
Figure 7B:
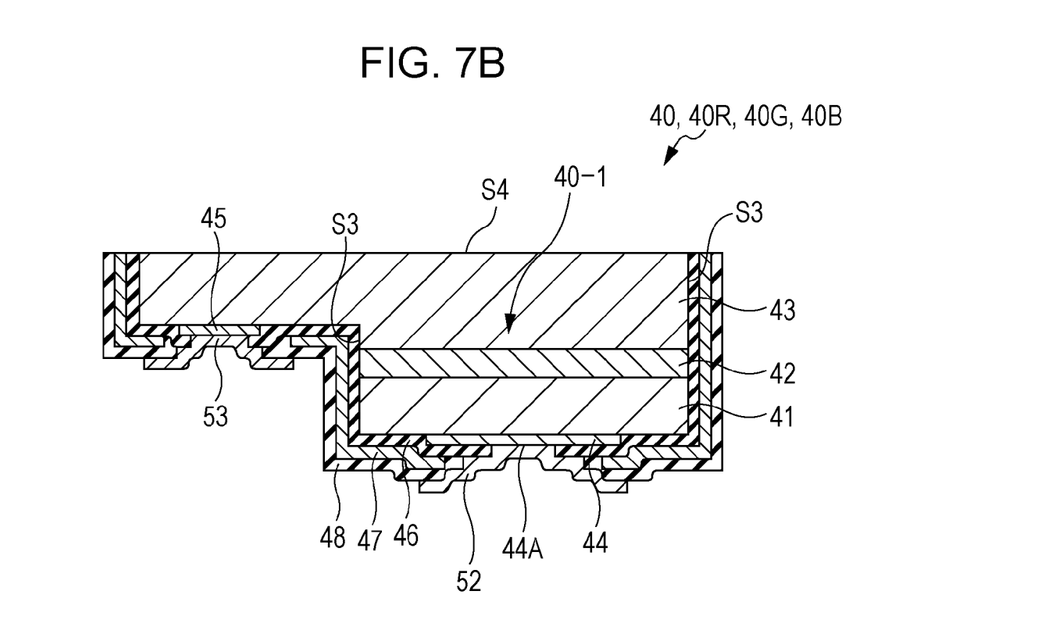

In the second embodiment, the first insulation layer 46, the metal layer 47 and the second insulation layer 48 are mainly formed at the side surface S3 of the mesa portion 40-1 and not installed at the entire side surface of the light emitting element 40, but it may also be installed at the entire side surface of the light emitting element 40. For example, as shown in FIGS. 7A and 7B, the end portions of the first insulation layer 46, the metal layer 47 and the second insulation layer 48 may be formed at the center of the side surface of the light emitting element 40, from the end portion at the light emitting surface S4 side over the outer circumference of the surface of the first electrode 44.

In the second embodiment, the embedding layer 49 covering the mesa portion 40-1 is installed, but it may be excluded. For example, as shown in FIGS. 7A and 7B, the embedding layer 49 and the bumps 50 and 51 may be excluded so that the pad electrode 52 directly contacts the first electrode 44 and the pad electrode 53 directly contacts the second electrode 45.

3. Third Embodiment

Configuration

Figure 8:
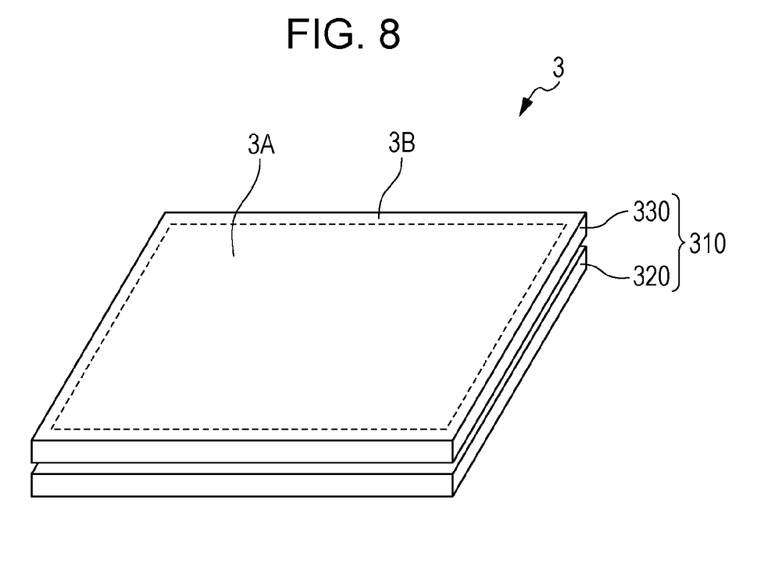
FIG. 8 is a perspective view showing an example of a configuration of a display device according to a third embodiment of the present disclosure.

Next, a display device 3 according to a third embodiment of the present disclosure will be described. The display device 3 includes the light emitting unit 1 or the light emitting unit 2 according to the above embodiment as a display pixel. FIG. 8 is a perspective view showing an example of a general configuration of the display device 3. The display device 3 is a so-called LED display, and an LED is used as a display pixel. The display device 3 includes, for example, a display panel 310 and a driving circuit (not shown) for driving the display panel 310 as shown in FIG. 8.

Display Panel 310

The display panel 310 is configured so that mounting substrates 320 and transparent substrates 330 are put alternately. The surface of the transparent substrate 330 becomes an image display surface to have a display region 3A at the center portion and have a frame region 3B, which is a non-display region, around it.

Mounting Substrate 320

Figure 9:
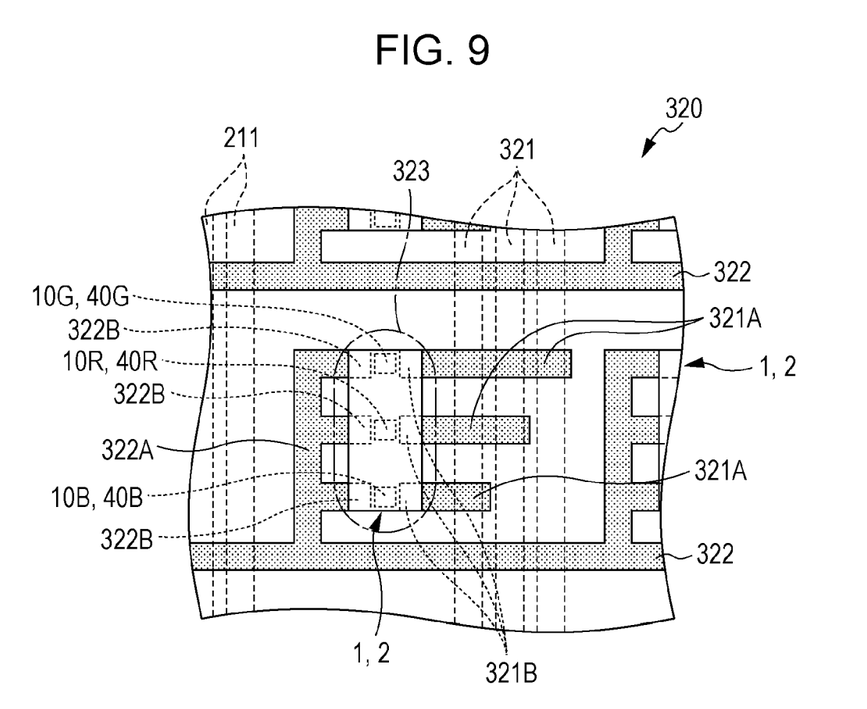
FIG. 9 is a plan view showing an example of a layout of a surface of a mounting substrate of FIG. 8.

FIG. 9 shows an example of a layout of a region of the surface of the mounting substrate 320 at the transparent substrate 330 side, which corresponds to the display region 3A. In the region of the surface of the mounting substrate 320 which corresponds to the display region 3A, for example, as shown in FIG. 9, a plurality of data wires 321 are formed to extend in a predetermined direction and is arranged in parallel with a predetermined pitch. In the region of the surface of the mounting substrate 320 which corresponds to the display region 3A, further for example, a plurality of scan wires 322 are formed to extend in a direction crossing with (for example, perpendicular to) the data wire 321 And are arranged in parallel with a predetermined pitch. The data wire 321 and the scan wire 322 are made of, for example, conductive material such as Cu (copper) or the like.

The scan wire 322 is formed, for example, at the outermost layer, for example on an insulation layer (not shown) formed on the substrate surface. In addition, the base material of the mounting substrate 320 is made of, for example, a glass substrate, a resin substrate or the like, and the insulation layer on the substrate is made of, for example, SiN, $SiO_2$, or $Al_2O_3$.

Meanwhile, the data wire 321 is formed in a layer other than the outermost layer including the scan wire 322 (for example, a layer below the outermost), and, for example, is formed in the insulation layer on the substrate. On the surface of the insulation layer, in addition to the scan wire 322, for example, a block is installed as necessary. The block is for enhancing a contrast, and is made of light-absorbing material. The block is formed, for example, at a region of the surface of the insulation layer where pad electrodes 321B and 322B, described later, are not formed. In addition, the block may be excluded if necessary.

A neighborhood of a crossing portion of the data wire 321And the scan wire 322 becomes a display pixel 323, and a plurality of display pixels 323 are disposed in the display region 3A in a matrix shape. At each display pixel 323, the light emitting unit 1 including a plurality of light emitting elements 40 or the light emitting unit 2 including a plurality of light emitting elements 40 is mounted. In addition, FIG. 9 exemplarily shows the case where a single display pixel 323 is configured with three light emitting elements 10R, 10G and 10B or three light emitting elements 40R, 40G and 40B so that the light emitting element 10R or the light emitting element 40R outputs a light of red color, the light emitting element 10G or the light emitting element 40G outputs a light of green color, and the light emitting element 10B or the light emitting element 40B outputs a light of blue color, respectively.

At the light emitting unit 1 and 2, a pair of terminal electrodes 31 and 32 or a pair of terminal electrode 61 and 62 is installed to each of the light emitting element 10R, 10G and 10B or the light emitting element 40R, 40G and 40B. In addition, one terminal electrode 31 or terminal electrode 61 is electrically connected to the data wire 321, and the other terminal electrode 32 or terminal electrode 62 is electrically connected to the scan wire 322. For example, the terminal electrode 31 or the terminal electrode 61 is electrically connected to the pad electrode 321B of the front end of a branch 321A installed at the data wire 321. In addition, for example, the terminal electrode 32 or the terminal electrode 62 is electrically connected to the pad electrode 322B of the front end of a branch 322A installed at the scan wire 322.

Each pad electrode 321B and 322B is formed, for example, at the outermost layer, and, for example, as shown in FIG. 9, is installed at a portion where each light emitting unit 1, 2 is mounted. Here, the pad electrodes 321B and 322B are made of, for example, conductive material such as Au (gold).

At the mounting substrate 320, further for example, a plurality of supports (not shown) for regulating a gap between the mounting substrate 320 and the transparent substrate 330 are installed. The support may be installed within a region opposite to the display region 3A and may be installed within a region opposite to the frame region 3B.

Transparent Substrate 330

The transparent substrate 330 is made of, for example, a glass substrate, a resin substrate or the like. The surface of the transparent substrate 330 at the light emitting unit 1, 2 side may be flat, but is preferably a rough surface. The rough surface may be installed over the entire region opposite to the display region 3A, or may be installed only in the region opposite to the display pixel 323. The rough surface has an unevenness as fine as scattering an incident light when the light generated from the light emitting elements 10R, 10G and 10B or the light emitting element 40R, 40G and 40B is incident to the corresponding rough surface. The unevenness of the rough surface may be manufactured by, for example, sand blast, dry etching or the like.

Driving Circuit

The driving circuit drives each display pixel 323 (each light emitting unit 1, 2) based on an image signal. The driving circuit includes, for example, a data driver for driving the data wire 321 connected to the display pixel 323 and a scan driver for driving the scan wire 322 connected to the display pixel 323. The driving circuit may be, for example, mounted on the mounting substrate 320, or may be installed independently from the display panel 310 and connected to the mounting substrate 320 through a wire (not shown).

Operation and Effects of the Display Device 3

In this embodiment, the light emitting unit 1, 2 is driven by the driving circuit through the data wire 321 and the scan wire 322 disposed in a simple matrix pattern (simple matrix driving). By doing so, current is supplied to the light emitting unit 1, 2 installed near the crossing portion of the data wire 321 and the scan wire 322 one by one so that an image is displayed on the display region 3A.

However, in this embodiment, the light emitting unit 1, 2 is used as the display pixel 323. By doing so, a bad influence (for example, degradation of a resin without light resistance against a blue color) caused by the light propagating in the insulating body 20, 50 of the light emitting unit 1, 2 may be reduced, or the excitation of the light emitting element 10R, 40R caused by the light generated from the light emitting element 10B, 40B may be prevented. As a result, the change of color temperature or the decrease of a color reproduction range may be reduced, and so it is possible to reduce the aging degradation of the image quality.

In addition, in this embodiment, in the case where the surface of the transparent substrate 330 is a rough surface, the light generated from the light emitting unit 1, 2 in an inclined direction is partly scattered by the rough surface. By doing so, the scattered light is partly emitted out through the transparent substrate 330, and so it is possible to suppress that the light generated from the light emitting unit 1, 2 in an inclined direction is reflected on the rear surface of the transparent substrate 330 or is confined in the transparent substrate 330 to generate stray light. Therefore, the deterioration of light emitting efficiency caused by the transparent substrate 330 may be suppressed.

Heretofore, the present disclosure has been described based on a plurality of embodiments and their modifications, but the present disclosure is not limited to those embodiments but may be modified in various ways.

For example, even though the light emitting unit 1, 2 has three light emitting elements 10, 40 in the above embodiments, it may include only two light emitting elements 10 or four or more light emitting elements 10, 40.

The present disclosure contains subject matter related to that disclosed in Japanese Priority Patent Application JP 2011-043710 filed in the Japan Patent Office on Mar. 1, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A light emitting unit comprising:
   plural kinds of light emitting elements with different light emitting wavelengths, wherein, among the plural kinds of light emitting elements, at least a first light emitting element includes:
   a semiconductor layer configured by laminating a first conductive layer, an active layer and a second conductive layer and having an exposed side surface of the first conductive layer, the active layer and the second conductive layer;
   a first electrode electrically connected to the first conductive layer;
   a second electrode electrically connected to the second conductive layer;
   a first insulation layer contacting at least the exposed side surface of the active layer in the semiconductor layer and contacting at least a portion of a back surface of the first electrode;
   a metal layer contacting at least a surface of the first insulating layer, which is opposite to the exposed side surface of the active layer, wherein the metal layer is electrically separated from the first electrode and the second electrode and a peripheral region of the metal layer fully extends beyond an edge of the first electrode and is parallel to the first electrode;
   a second insulation layer formed over at least the peripheral region of the metal layer; and
   a pad electrode electrically connected to an exposed region of the back surface of the first electrode and formed to extend beyond an edge of the first insulation layer and an edge of the peripheral region of the metal layer.

2. The light emitting unit according to claim 1, wherein the first insulation layer and the metal layer cover at least the entire side surface.

3. The light emitting unit according to claim 2, wherein the first insulation layer is formed by CVD (Chemical Vapor Deposition), deposition, or sputtering.

4. The light emitting unit according to claim 1, wherein the first electrode is a metal electrode that contacts a first surface of the first conductive layer, wherein the first surface is a side of the first conductive layer that is opposite to the active layer, and
   wherein the first insulation layer and the metal layer extend from the side surface to a region over the first electrode.

5. The light emitting unit according to claim 4, wherein a first part of the first insulation layer that extends over the first electrode extends beyond the metal layer.

6. The light emitting unit according to claim 5, wherein the pad electrode further extends over an edge of the second insulation layer.

7. The light emitting unit according to claim 5, wherein the pad electrode physically contacts the exposed region of the first electrode.

8. The light emitting unit according to claim 1, wherein the plural kinds of light emitting elements include a light emitting element emitting a blue light, a light emitting element emitting a green light and a light emitting element emitting a red light, and
   wherein, among these three kinds of light emitting elements, at least the light emitting element emitting a blue color and the light emitting element emitting a green light have the semiconductor layer, the first electrode, the second electrode, the first insulation layer and the metal layer.

9. The light emitting unit according to claim 1, further comprising an insulating body for surrounding each light emitting element by the same member.

10. A display device comprising:
    a display panel having a plurality of light emitting units; and
    a driving circuit for driving each light emitting unit based on an image signal, wherein each light emitting unit has plural kinds of light emitting elements with different light emitting wavelengths, and wherein, among the plural kinds of light emitting elements, at least a first light emitting element includes:

a semiconductor layer configured by laminating a first conductive layer, an active layer and a second conductive layer and having an exposed side surface of the first conductive layer, the active layer and the second conductive layer;

a first electrode electrically connected to the first conductive layer;

a second electrode electrically connected to the second conductive layer;

a first insulation layer contacting at least the exposed side surface of the active layer in the semiconductor layer and contacting at least a portion of a back surface of the first electrode;

a metal layer contacting at least a surface of the first insulating layer, which is opposite to the exposed side surface of the active layer, wherein the metal layer is electrically separated from the first electrode and the second electrode and a peripheral region of the metal layer fully extends beyond an edge of the first electrode and is parallel to the first electrode;

a second insulation layer formed over at least the peripheral region of the metal layer; and a pad electrode electrically connected to an exposed re ion of the back surface of the first electrode and formed to extend beyond an edge of the first insulation layer and an edge of the peripheral region of the metal layer.

11. The display device of claim 10, wherein the display panel comprises:

a mounting substrate on which are mounted the plurality of light emitting units; and a transparent substrate disposed adjacent to the mounting substrate.

12. The display device of claim 11, further comprising a scattering surface disposed across a display region of the display panel.

13. The display device of claim 10, wherein the first insulation layer and the metal layer cover at least the entire side surface.

14. The display device of claim 10, wherein the first electrode is a metal electrode that contacts a first surface of the first conductive layer, wherein the first surface is a side of the first conductive layer that is opposite to the active layer, and wherein the first insulation layer and the metal layer extend from the side surface to a region over at least a portion of the first electrode.

15. The display device of claim 14, wherein a first part of the first insulation layer that extends over the first electrode extends beyond the metal layer.

16. The display device of claim 15, wherein the pad electrode further extends over an edge of the second insulation layer.

17. The display device of claim 16, wherein the pad electrode and metal layer form a constriction in the second insulation layer adjacent the edge of the peripheral region of the metal layer.

18. The display device of claim 10, wherein the plural kinds of light emitting elements include a light emitting element emitting a blue light, a light emitting element emitting a green light and a light emitting element emitting a red light, and wherein, among these three kinds of light emitting elements, at least the light emitting element emitting a blue color and the light emitting element emitting a green light have the semiconductor layer, the first electrode, the second electrode, the first insulation layer and the metal layer.

* * * * *